United States Patent [19]
Gardner et al.

[11] Patent Number: 6,075,702
[45] Date of Patent: Jun. 13, 2000

[54] HEAT TRANSFER DEVICE FOR A RETENTION ASSEMBLY

[75] Inventors: Susannah Gardner, San Carlos; Herman Wai-Tong Chu, Palo Alto; Gwen M. Bertolami, Menlo Park, all of Calif.

[73] Assignee: Hewlett-Packard Company, Palo Alto, Calif.

[21] Appl. No.: 09/318,569

[22] Filed: May 26, 1999

[51] Int. Cl.[7] .................................................. H05K 7/20
[52] U.S. Cl. .......................... 361/704; 361/702; 361/707; 361/717; 361/725; 361/741; 361/754; 257/707; 257/713; 257/726; 165/80.3; 165/185; 174/16.1; 174/16.3
[58] Field of Search ........................... 361/686, 701–710, 361/690, 715–719, 722, 725, 728, 731–732, 734, 752–753, 796–802, 816, 818, 683, 687, 727–730, 754; 174/16.1, 52.1, 57, 16.3, 51; 165/60.3, 185, 80.2, 80.3, 80.4, 165; 257/706–727; 439/160, 571; 433/160, 571

[56] References Cited

U.S. PATENT DOCUMENTS

| | | | |
|---|---|---|---|
| 5,024,264 | 6/1991 | Natori et al. ................................ | 165/1 |
| 5,436,794 | 7/1995 | Clemente et al. ....................... | 361/704 |
| 5,724,729 | 3/1998 | Sheriff et al. .............................. | 29/840 |
| 5,867,365 | 2/1999 | Chiou ....................................... | 361/690 |
| 5,870,286 | 2/1999 | Butterbaugh et al. ................... | 361/704 |
| 5,875,097 | 2/1999 | Amaro et al. ............................ | 361/704 |
| 5,906,497 | 5/1999 | Pham et al. .............................. | 439/160 |
| 5,982,622 | 11/1999 | Chiou ....................................... | 361/704 |

OTHER PUBLICATIONS

Intel, "S.E.C.C.2 Heat Sink Installation and Removal Process" (Application Note); Dec. 1998; pp. 1–13; http://www/intel.com.

Intel, "Single Edge Processor Package (SEPP) with the Intel® Celerom™ Processor", (Manufacturing Advantage Tips); 1999; pgs. (9); http://www/intel.com.

*Primary Examiner*—Leo P. Picard
*Assistant Examiner*—Michael Datskovsky

[57] ABSTRACT

A heat transfer device for use with a retention assembly is herein disclosed. The retention assembly is mounted over one or more connectors attached to a circuit board. The retention assembly houses one or more processor modules that mount into the connectors. The processor modules include a heat transfer device. The heat transfer device has a pair of rail guides that cover the outer edges of the processor module. The rail guides enable the processor module to slide in and out of the retention assembly thereby enabling the processor module to be securely mounted into the connector.

10 Claims, 13 Drawing Sheets

HEAT TRANSFER DEVICE FOR A
RETENTION ASSEMBLY

FIELD OF THE INVENTION

The present invention relates generally to electronic systems. More particularly, the invention relates to a heat transfer device for use in a retention assembly.

BACKGROUND OF THE INVENTION

A trend in the electronics industry is to generate smaller and faster electronic devices. As a result, these devices consume more power and hence, produce more heat. Excessive heat can cause significant damage to an electronic device thereby reducing its life. For this reason, various techniques are employed to eliminate or dissipate the heat generated from the electronic device.

A heat sink is one such technique. A heat sink is thermally coupled to the electronic device and as such, allows the heat to flow from the electronic device through the heat sink to the surrounding open space. FIG. 1 shows one such heat sink 100 that is designed for use with a single edge contact cartridge 2 (SECC2) package (not shown). The SECC2 package is a processor assembly that is distributed by the Intel Corporation. There is shown a heat sink 100 having a base portion 102, fins 104, and alignment tabs 106a–106b. The fins 104 conduct heat away from the electronic components on the SECC2 package. There are alignment tabs 106 on either side of base portion 102. The alignment tabs 106 are used to properly align the heat sink 100 onto the SECC2 package when the heat sink 100 is installed on the SECC2 package.

The SECC2 package assembled with the heat sink 100 can be mounted onto a circuit board. Typically, the assembled SECC2 package is then placed into a retention mechanism in order to maintain the stability of the assembled SECC2 package onto the circuit board. However, the retention mechanism may not be adequate to maintain the requisite stability to satisfy mechanical shock and vibration and to avoid damage to the circuit board. Accordingly, there is a need for a mechanism that can more effectively retain a heat sink coupled to a processor assembly to a circuit board.

SUMMARY OF THE INVENTION

The present invention pertains to a heat transfer device that is used with a retention assembly that is mounted onto a circuit board. Preferably, the heat transfer device is coupled to a printed circuit board (PCB) assembly that is mounted into a processor retention assembly and inserted into a connector affixed to a circuit board.

The heat transfer device includes a base pedestal, fins, lever guides, and rail guides. The base pedestal is in thermal contact with the PCB assembly. The fins extend outwardly and upwardly from the base pedestal and transfer heat generated from the PCB assembly to the ambient air. The lever guides are used in combination with lock levers of the processor retention assembly to secure the heat transfer device assembled with the PCB assembly to the processor retention assembly. The rail guides extend downwardly from the base pedestal and cover opposite sides of the PCB assembly. The rail guides enable the assembled heat sink and PCB assembly to be detachably mounted to the processor retention assembly.

The processor retention assembly is positioned over one or more connectors that are mounted onto a circuit board. The processor retention assembly has two parallel walls where each wall has one or more processor rails. The processor rails include a pair of flanges that form a channel. Each rail guide of the heat transfer device is inserted into a respective channel and slid in a downward direction until the PCB assembly is inserted into a connector.

A lock lever is pivotally coupled to each processor rail and is used to secure the assembled heat transfer device and PCB assembly to the processor retention assembly. Each lock lever snaps into the lever guide of the heat transfer device thereby securing each assembled heat transfer device and PCB assembly to the processor retention assembly.

The heat transfer device has a significant economic advantage. The inclusion of the lever and rail guides on the heat sink eliminates the need for any additional components or complex mounting mechanisms on the processor retention assembly. As such, the processor retention assembly is easier to manufacture and less costly. In addition, the heat sink can be used with other types of processor assemblies, circuit boards, edge finger connection devices, and the like without affecting the processor retention assembly.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
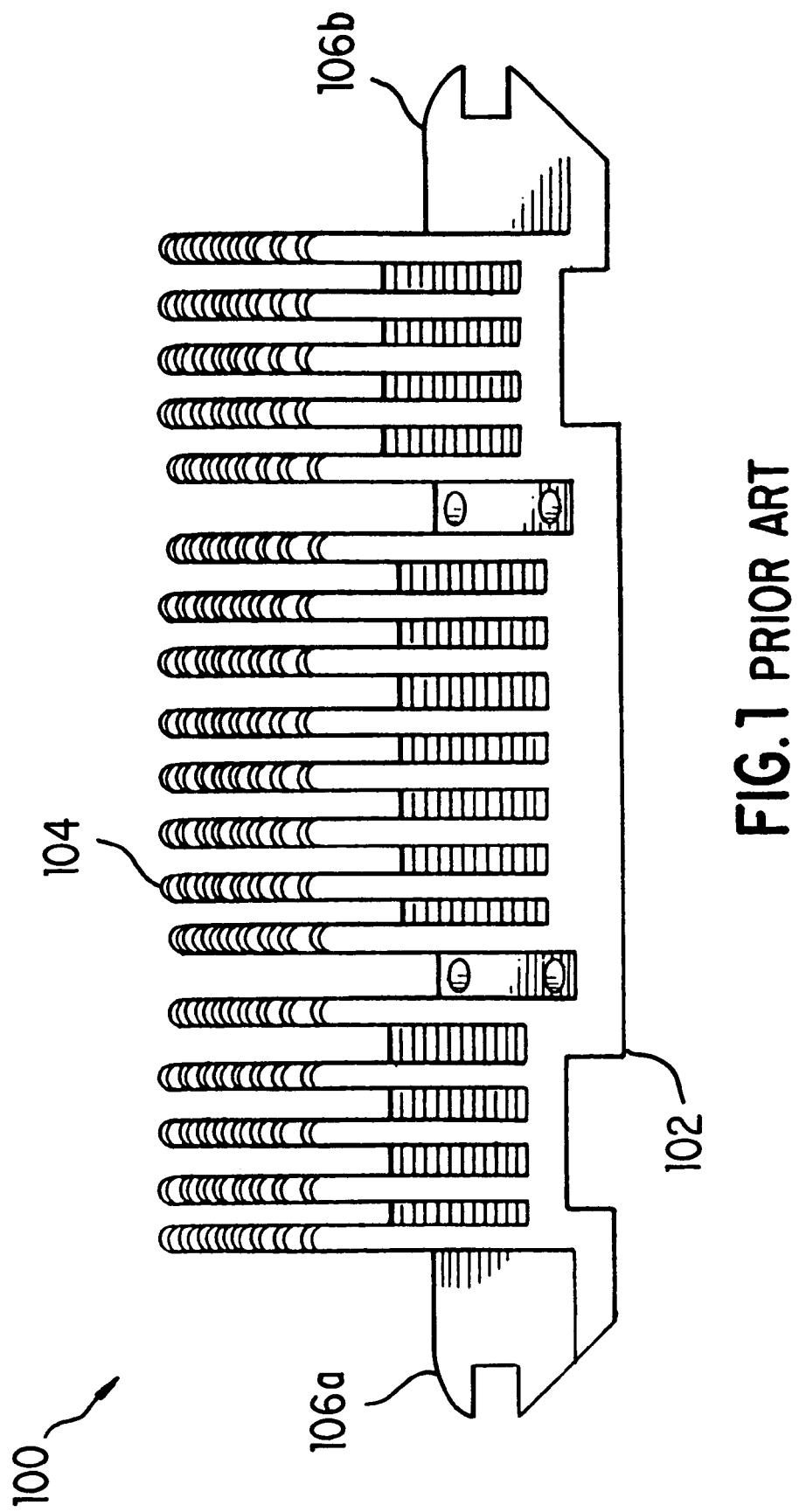
FIG. 1 is a schematic view of a prior art heat sink.
Figure 2:
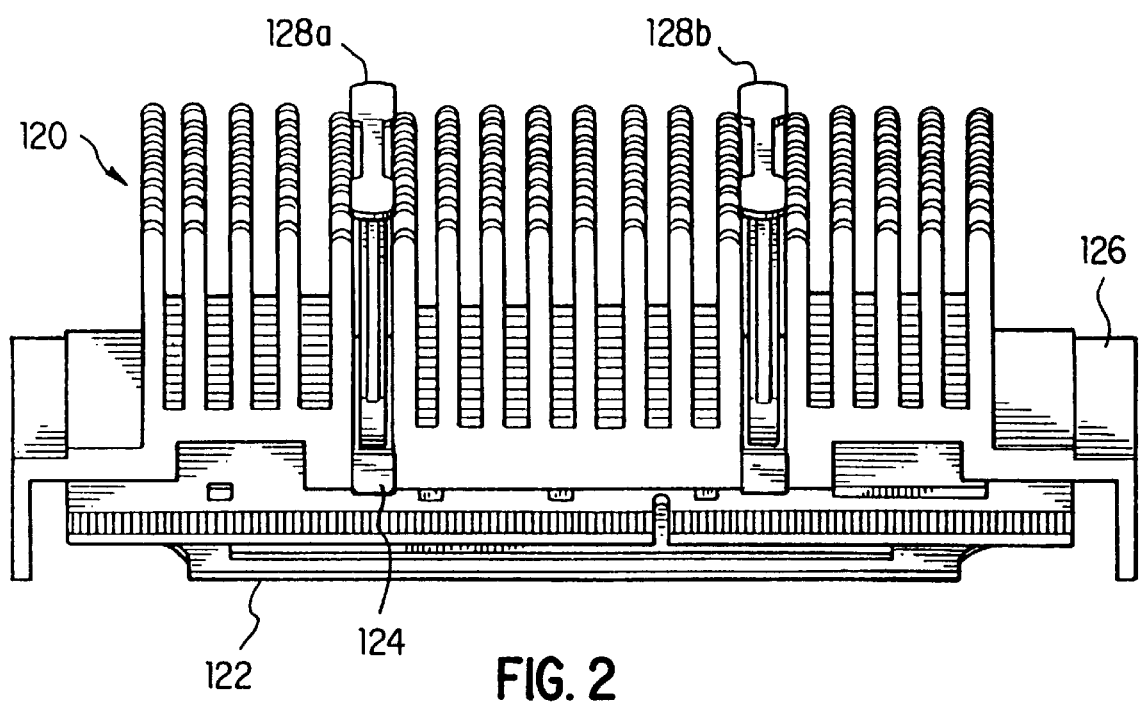
FIG. 2 is a plan view of a processor module in accordance with a first embodiment of the present invention.
Figure 3:
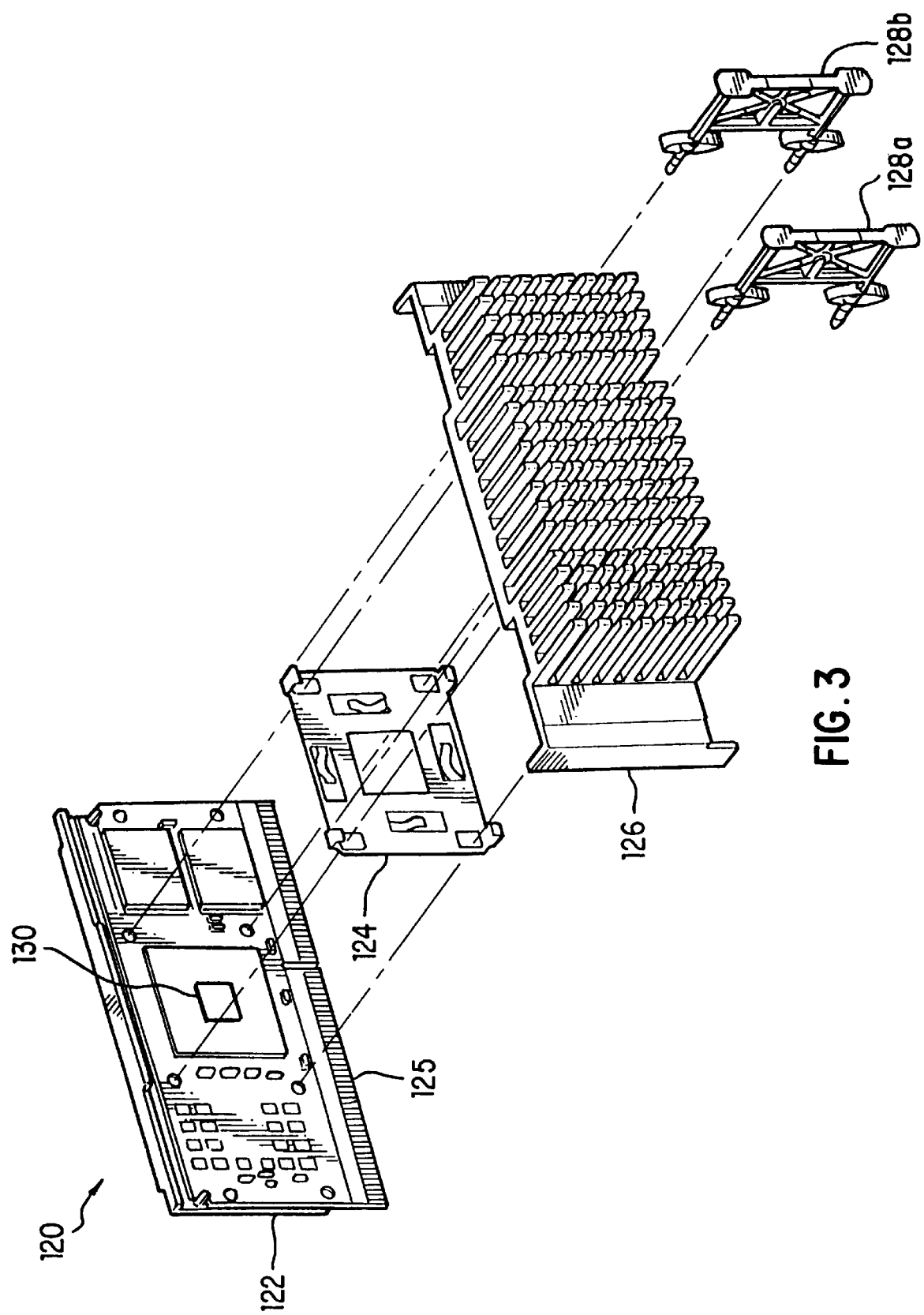
FIG. 3 is an exploded view of the components of the processor module shown in FIG. 2.

FIGS. 2 and 3 depict a processor module 120 having an electronic package, such as a PCB assembly 122, an EMI clip or reduction device 124, a heat sink 126, and a pair of heat sink retention clips 128a–128b. The PCB assembly 122 includes a processor core 130. The EMI clip 124 is positioned onto the PCB assembly 122 surrounding the processor core 130 and is used to efficiently shield the EMI emissions generated from the processor core 130. The EMI clip 124 is removably mounted to the heat sink 126. The heat sink 126 is thermally coupled to the PCB assembly 122 and is used to transfer heat generated from the PCB assembly 122 to the ambient air. A pair of heat sink retention clips 128 is used to fasten the heat sink 126 to the PCB assembly 122.

Figure 4:
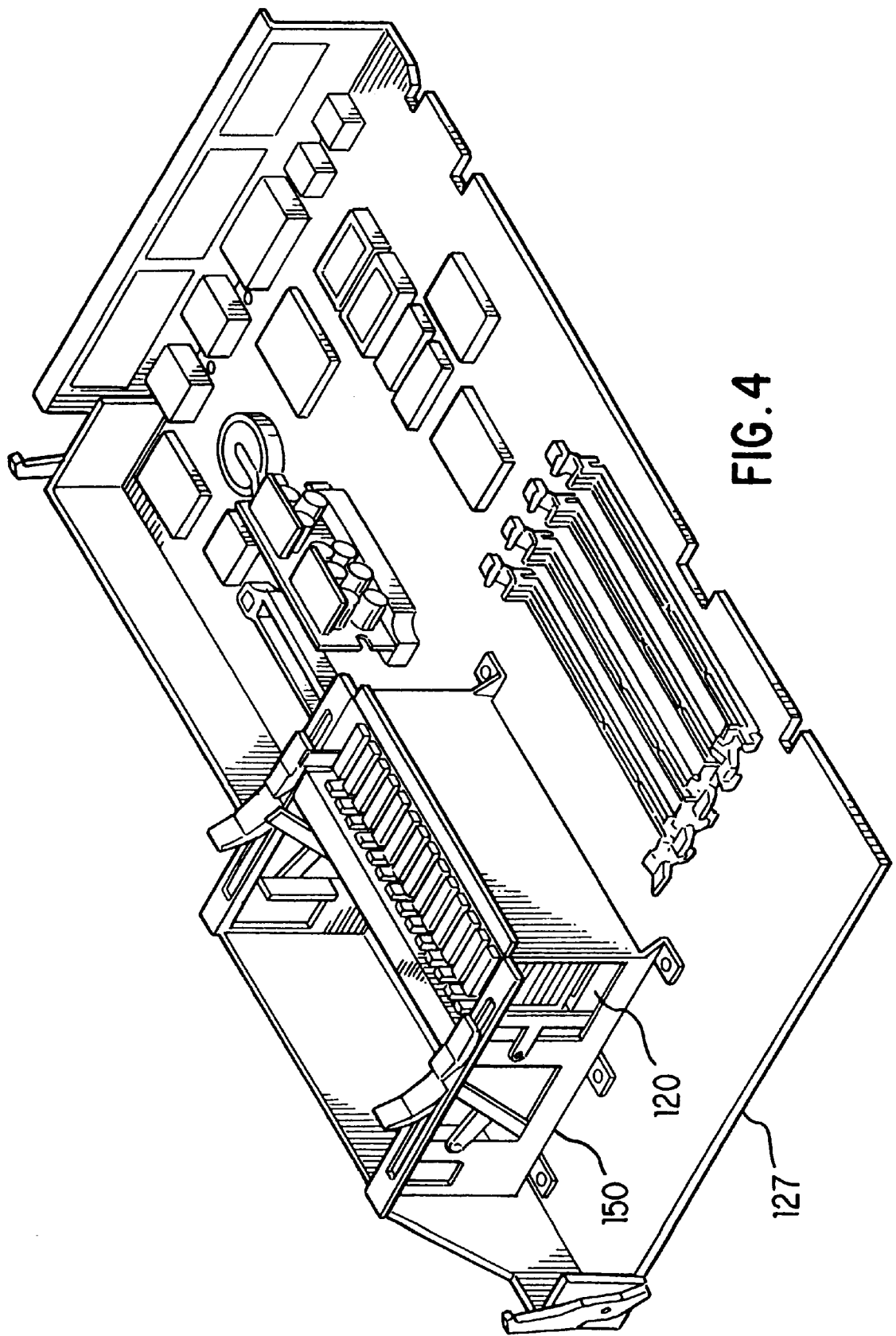
FIG. 4 illustrates the processor module mounted into a connector residing on a circuit board that is part of a computer system.

The processor module 120 can be removably mounted onto a motherboard or other type of circuit board. For example, as shown in FIG. 4, the processor module 120 is positioned onto a motherboard 127 through a processor retention assembly 150. The motherboard 127 can be part of a computer system, subsystem, or the like.

Preferably, the PCB assembly 122 is a Single Edge Contact Cartridge 2 (SECC2) manufactured by the Intel Corporation. The SECC2 supports "slot" type processors. A slot is a connector that is resident on a motherboard and which supports the Intel P6 microprocessor bus. Previously, microprocessors were mounted onto a motherboard through a socket. In a slot-type processor, the processor is placed on a PCB known as a single edge contact (SEC). The SEC has pins on an edge of the card which is inserted into a 242-pin slot on the motherboard. This type of pin construction is otherwise known as an edge finger connection and exists on other types of circuit boards. Referring to FIG. 3, there is shown an edge finger connection 125 on the PCB assembly 122.

A more detailed discussion of the SECC2 can be found in Intel Corporation, Single Edge Contact Connector 2 (S.E.C.C.2) Thermal Interface Material Functional Requirements, Order No: 244458-001, November 1998; Intel Corporation, Single Edge Contact Cartridge 2 (S.E.C.C.2) Heat Sink Attachment and Heat Sink Functional Requirements Order Number: 244456-001, Nov. 23, 1998; and Intel Corporation, S.E.C.C.2 Heat Sink Installation and Removal Process, Order Number 244454-001, December 1998 which are hereby incorporated by reference as background information.

However, it should be noted that the technology of the present invention is not constrained to the SECC2 processor assembly and can be used with other types of processors, retention assemblies, circuit boards, and the like.

Figure 5:
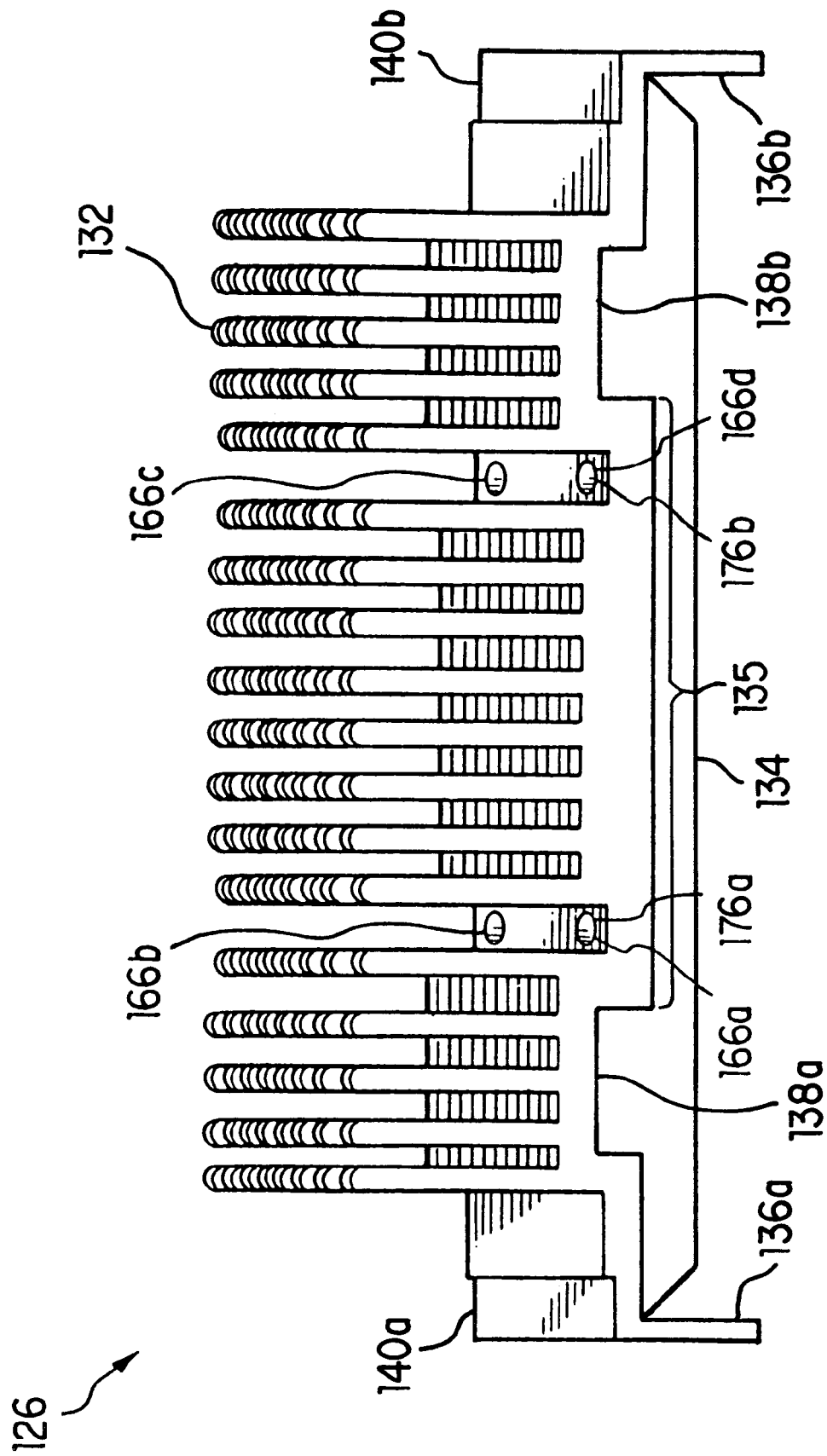
FIG. 5 is a perspective view of the heat sink shown in FIGS. 2–3.
Figure 6:
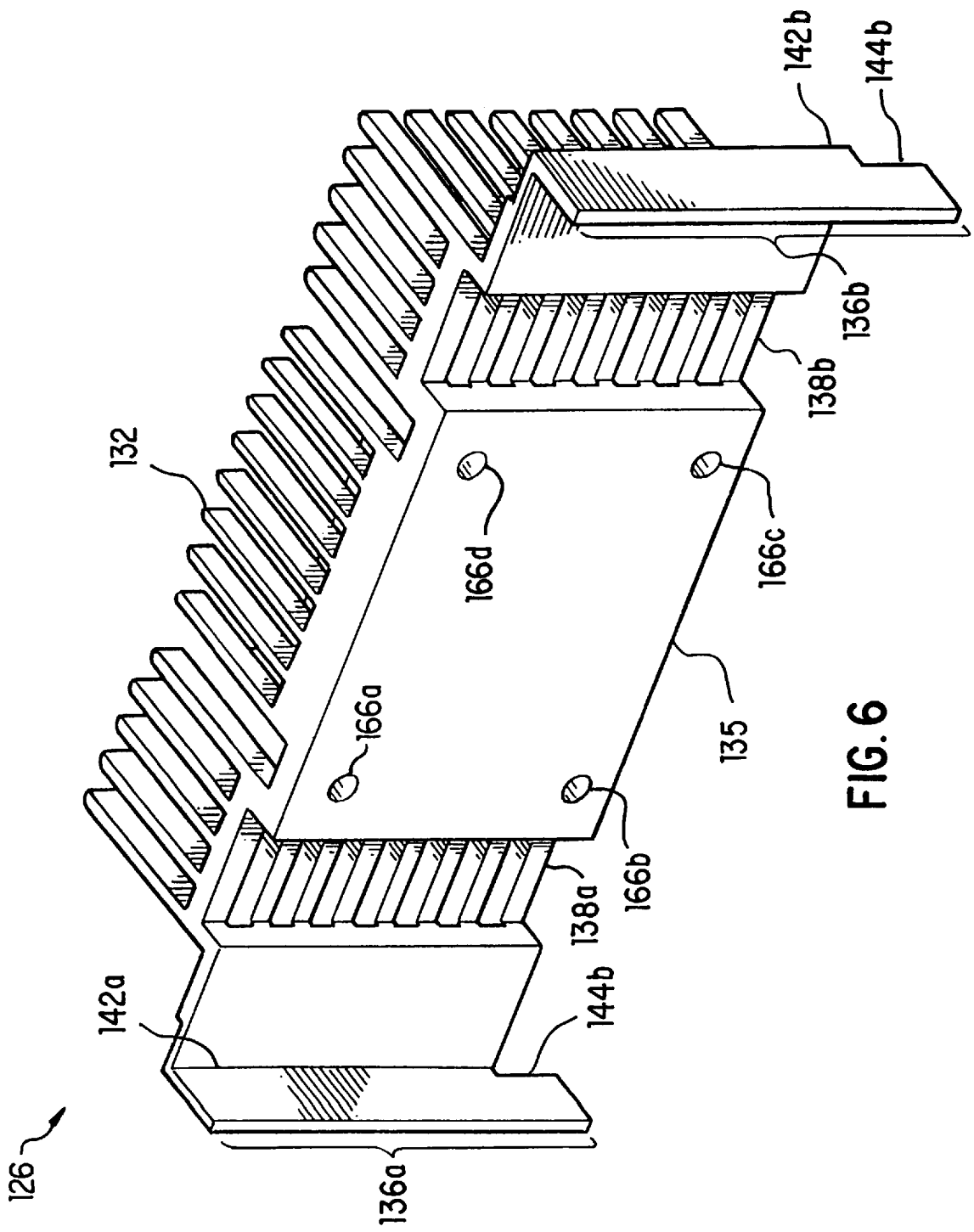
FIG. 6 is a rear perspective view of the heat sink in accordance with a first embodiment of the present invention.

FIGS. 5 and 6 illustrate the heat sink 126 and FIG. 2 illustrates the heat sink 126 coupled with the PCB assembly 122. The heat sink 126 has a number of fins 132, a base portion 134, two rail guides 136a–136b, and two apertures 138a–138b. The fins 132 project outwardly and upwardly from the base portion 134 and are used to conduct heat away from the electronic components in thermal contact with the base pedestal 135. The base portion 134 includes a base pedestal 135 that extends over and covers the processor core 130 thereby providing the maximum amount of thermal contact area between the processor core 130 and the heat sink 126. The two apertures 138a–138b are positioned on either side of the base pedestal 135 and are used to provide an air flow to cool the PCB assembly 122.

The base portion 134 includes lever guides 140a–140b or flanges that are used to retain the processor module 120 into the processor retention assembly 150. Each lever guide 140 is used with a lock lever 178 that is described more fully below. As such, the width of the lever guide 140 is based on the width of the lock lever 178 since the lock lever 178 snaps onto the lever guide 140 when the processor module 120 is secured to the processor retention assembly 150. It should be noted that the dimensions of the base portion 134 and the lever guide 140 are not a limitation of the present invention and that alternate dimensions can be used.

The two rail guides 136a–136b extend downward and perpendicularly from the base pedestal 134 and when coupled with the PCB assembly 122, the rail guides 136 extend over and cover opposite sides of the PCB assembly 122. The rail guides 136 are used to slide the processor module 120 into a processor retention assembly 150 that is described more fully below.

The rail guides 136 are used to slide the processor module 120 in and out of the processor retention assembly 150. The rail guides 136 have a base portion 142 and an elongated portion 144. The dimension of the base portion 142 is based on the width of the processor rail 160 of the processor retention assembly 150 since the base portion 142 fits into the processor rail 160. The elongated portion 144 fits into the bottom surface of the lock lever 178 and enables the lock lever 178 to move the heat sink 126 out of the processor retention assembly 152. The operation of the lock lever 178 with the heat sink 126 is described more fully below.

The fins 160 are eliminated where the heat sink retention clips 128 are positioned (see FIGS. 2 and 3) into two groves 176a–176b situated on the top surface of the base pedestal 134 of the heat sink 126. The groves 176 include mounting holes 166a–166d that enable the heat sink retention clips 128 to fit through the top surface of the base pedestal 134. The retention clips 128 are inserted through the mounting holes 166 on the heat sink 126 in a downward direction through the mounting holes on the EMI clip 124 through the mounting holes on the PCB 132.

The heat sink retention clips 128 are made from a flexible material that is non-electrically conductive, such as plastic. The heat sink retention clips 128 are secured at one end in any appropriate manner, and in the present example by barbed ties. Preferably, the heat sink retention clips 128 are those heat sink retention clips designed for the SECC2 and which are manufactured by ITW Fastex.

The heat sink 126 is made of aluminum that is chromate conversion coated and which is electrically conductive. A thermal compound, such as a dielectric layer, can be placed on the bottom side of the base pedestal 135 of the heat sink 126. This dielectric layer is used to provide high dielectric capacity and thermal conductivity between the processor core 130 and the heat sink 126. An example of such a compound is MCM-STRATE® manufactured by Power Devices, Inc. However, the present invention is not constrained to any particular type of material and other materials having the same properties can also be used.

Furthermore, the bottom side of the EMI clip 124, that side which touches the PCB assembly 122, is coated with a dielectric layer that ensures that the EMI clip 124 does not short the electronic components mounted on the surface of the PCB assembly 122. An example of such a dielectric coating is powder paint, in particular, the epoxy power coatings based on epoxy resins.

Figure 7:
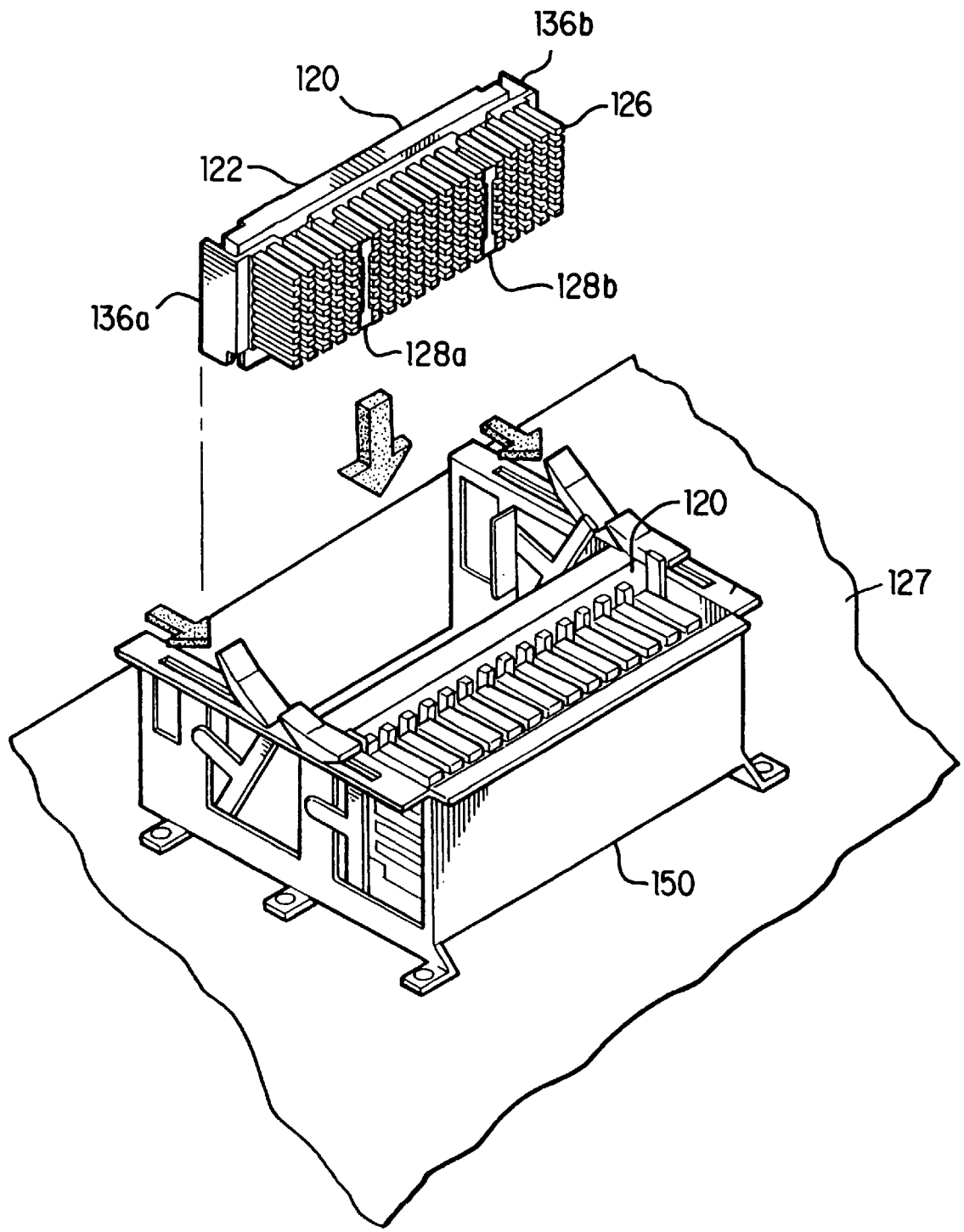
FIG. 7 is an isometric view of a processor module mounted onto a circuit board and housed in a processor retention assembly.

Referring to FIG. 7, the processor module 120 assembled with the heat sink 126 can then be placed into a processor retention assembly 150. The processor retention assembly 150 is mounted onto a circuit board, such as a motherboard, over one or more connectors.

Figure 8:
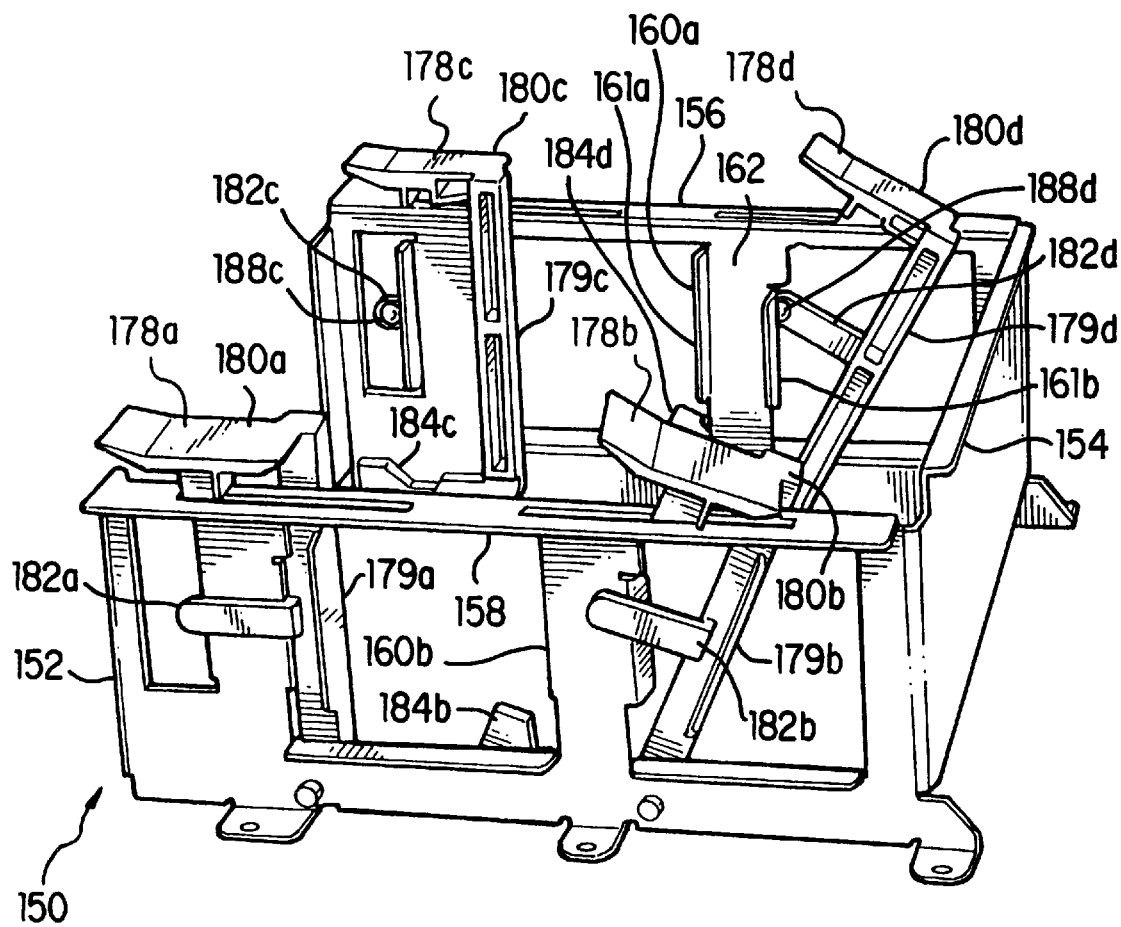
FIG. 8 is an isometric view of the cage of the processor retention assembly assembled with lock levers.

FIG. 8 illustrates the processor retention assembly 150 in more detail. There is shown a rectangular-shaped frame or cage 152 having a front upstanding wall or panel 154 and two side upstanding walls or panels 156, 158. The front panel 154 maintains the stability of the two side panels 156, 158, especially during shock and vibration. The two side panels 156, 158 provide the requisite mechanical support features for mounting and securing a processor module 120 into a connector and for securing the processor retention assembly 150 to a PCB. The cage 152 is fabricated as a single unit and made of sheet metal such as thin steel or aluminum.

A pair of processor rails 160a–160b are situated on the interior sides of the side panels 156, 158 and are used to secure a processor module 120 into a connector. The processor rails 160 include two flanges 161a, 161b that form a channel 162. Each rail guide 136a–136b of the heat sink 126 is placed into a respective channel 162 and slid in a downward direction so that the edge finger connection fits into the connector.

A lock lever 178 is coupled to each processor rail 160. As such, there are two lock levers 178 for each processor module 120. The lock levers 178 are used securely retain the processor module 120 into the processor retention assembly 150.

Each lock lever 178 has a base 179, an ejector handle 180, a handle lock 182, and an ejector lever 184. The ejector handle 180 is used to position the lock lever 178 in either the lock or release position. In the lock position, the processor module 120 is secured to the connector and to the cage 152. In the release position, the processor module 120 is released or ejected from the connector and the cage 152. As shown in FIG. 8, lock levers 178a, 178c are positioned in the lock position and lock levers 178b, 178d are positioned in the release or eject position.

The handle lock 182 is used to securely fasten the processor module 120 to the cage 150. This is important especially when the circuit board 127 undergoes mechanical shock and vibration. The processor retention assembly 150 is used to ensure that damage to the processor module 120 and the electronic components on the circuit board 127 is minimized as well as deflection to the circuit board 127.

Figure 9:
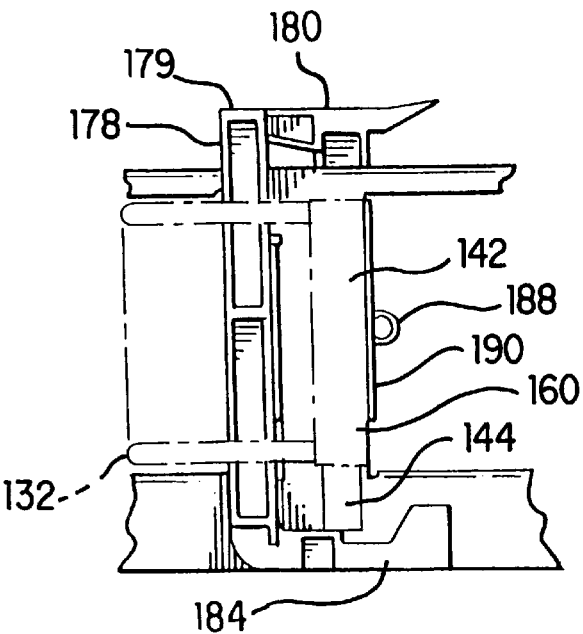
FIG. 9 is a view of the processor module housed in the processor retention assembly in a lock position.

At the outer edge of the interior side of the handle lock 182, there is a ball joint 188. Referring to FIG. 9, when the lock lever 178 is placed in the lock position, the handle lock 182 slides along the exterior side of the processor rail 160. The base 179 of the lock lever 178 fits into the lever guide 140 of the heat sink 126 and the ball joint 188 snaps into place on the outer side 190 of the processor rail 160.

Figure 10:
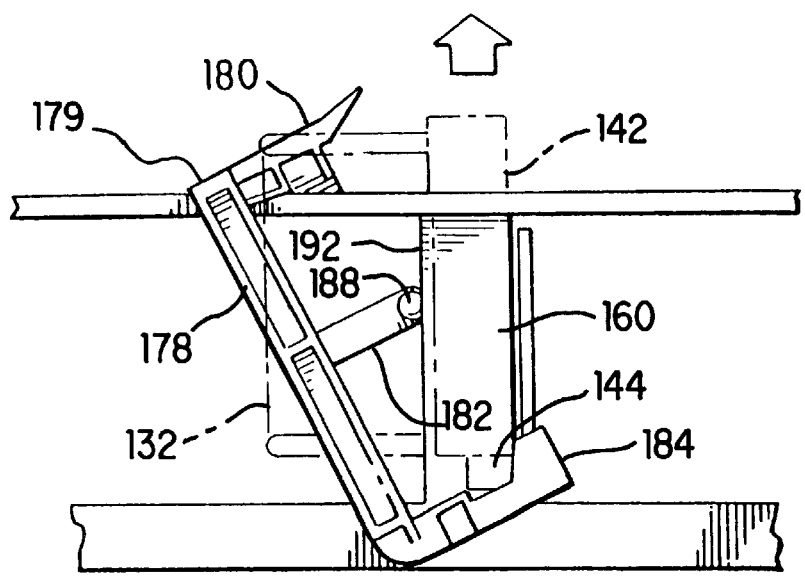
FIG. 10 is a view of the processor module housed in the processor retention assembly in a release position.

Referring to FIG. 10, when the lock lever 178 is placed into the release position the handle lock 182 slides along the exterior side of the processor rail 160 to the inner side 192 of the processor rail 160. The base 179 of the lock lever 178 is released from the lever guide 140 of the heat sink 126 and the ball joint 188 releases into place on the inner side 192 of the processor rail 160.

The ejector lever 184 is used to lift or eject the processor module 120 out of the connector and hence, the cage 152. As such, the ejector lever 184 is positioned so that it is under the bottom surface of the processor module 120 when the processor module 120 is fitted in the connector, as shown in FIG. 9. Referring to FIG. 9, the base portion 142 of the rail guide 136 of the heat sink 126 fits into the processor rail 160 with the elongated section 144 of the heat sink 126 making contact with the ejector lever 184. Referring to FIG. 10, when the ejector lever 184 is moved into the release position, the ejector lever 184 applies extraction force to the elongated section 144 of the heat sink 126. The extraction force moves the rail guide 136 of the heat sink 126 in an upward direction thereby moving the processor module 120 out of the processor retention assembly 150.

Figure 11:
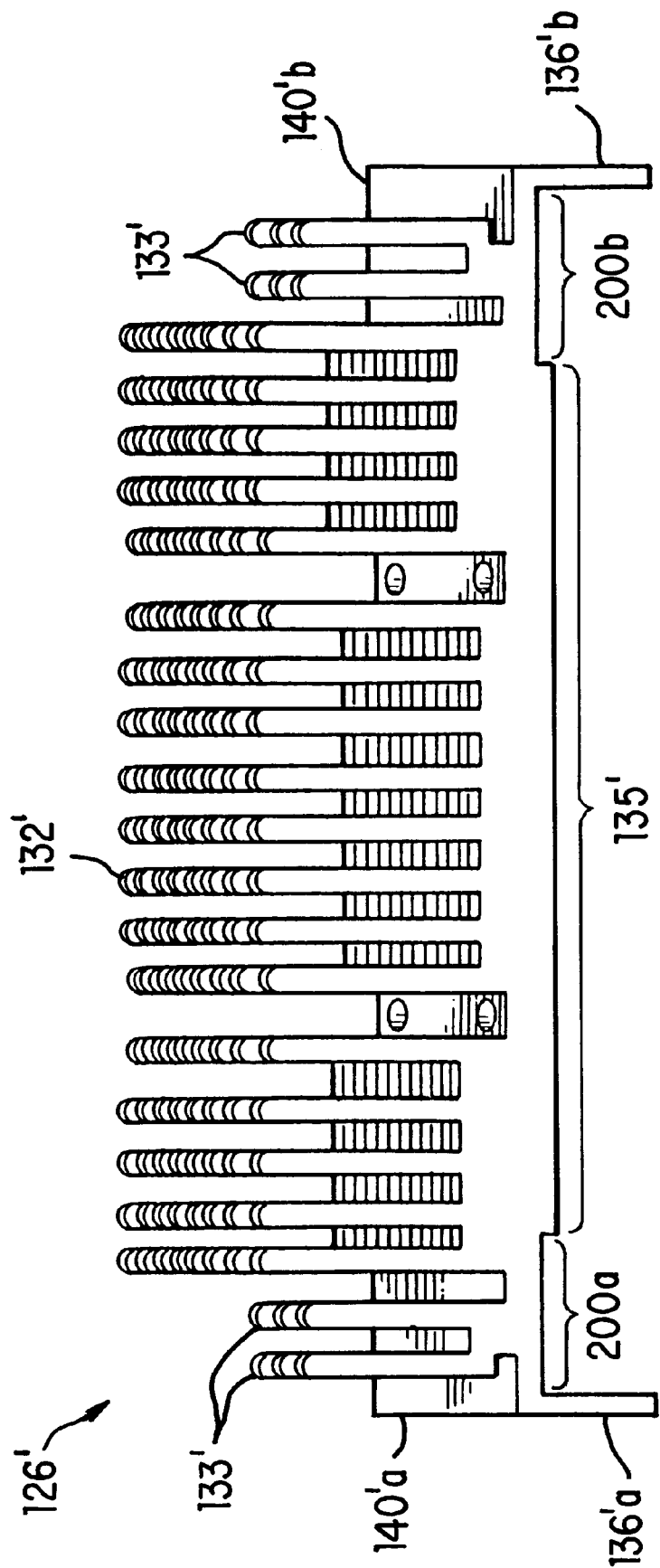
FIG. 11 is a plan view of a heat sink in accordance with a second embodiment of the present invention.
Figure 12:
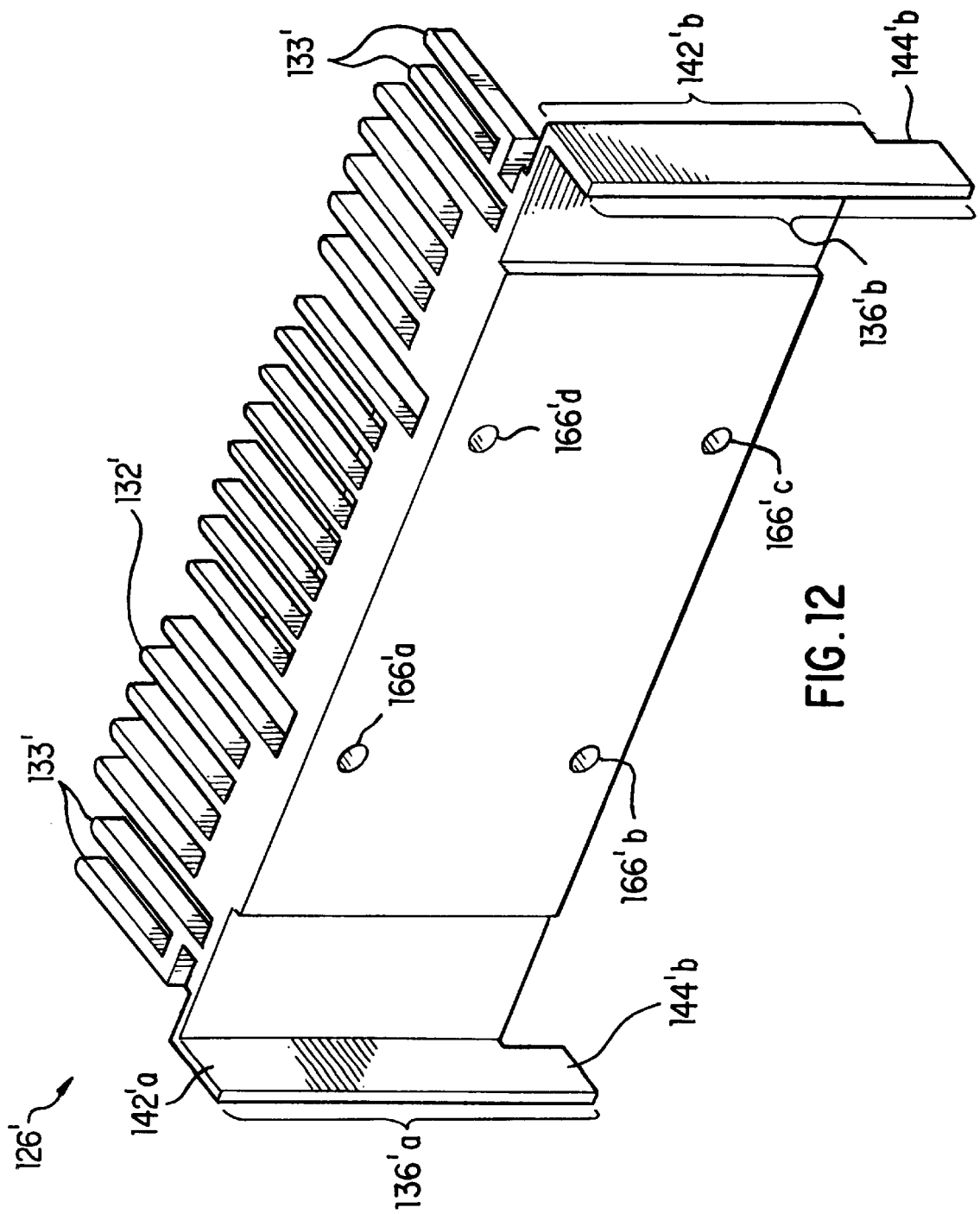
FIG. 12 is a rear perspective view of the heat sink shown in FIG. 11.

FIGS. 11 and 12 illustrate a second embodiment of the heat sink 126'. There is shown a heat sink 126' having fins 132', 133', a base pedestal 135', recessed portions 200a–200b, lever guides 140'a–140'b, and rail guides 136'a–136'b. The heat sink 126' is similar to the heat sink 126 described above except for the additional fins 133', the recessed portions 200a–200b, and the base pedestal 135'. The additional fins 133' are used to transfer heat generated from the PCB assembly 122 to the ambient air. The base pedestal 135' makes thermal contact with a larger area of the PCB assembly 122. The recessed portions 200a–200b are used to provide air passages that enable an airflow between the bottom surface of the heat sink 126' and the PCB assembly 122.

Figure 13:
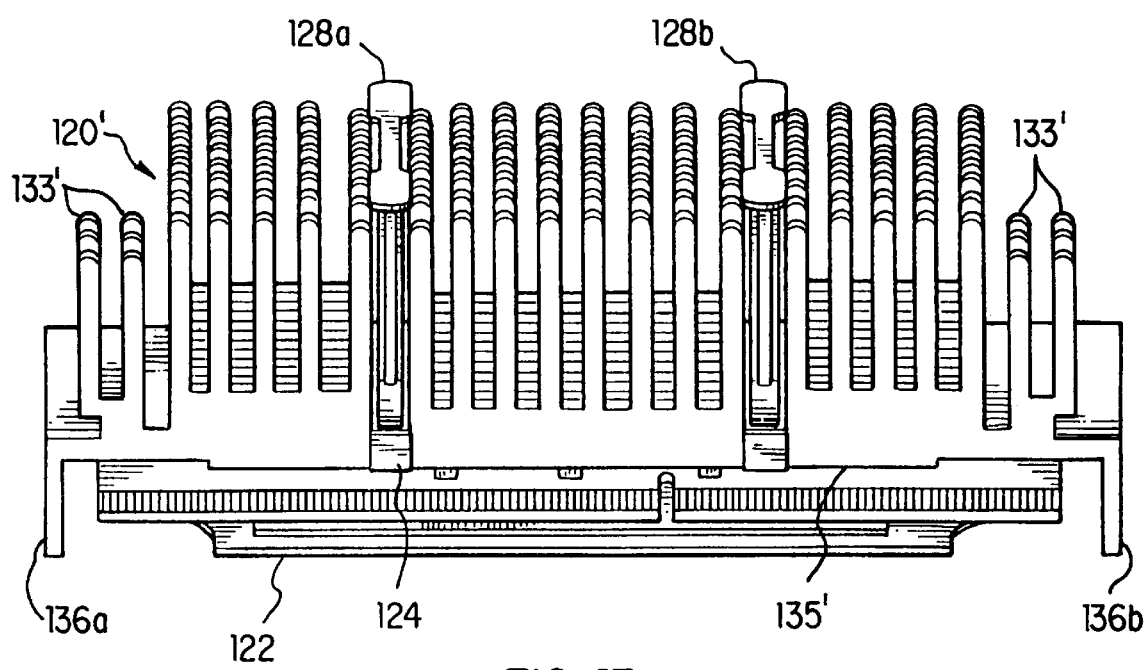
FIG. 13 is a plan view of a processor module utilizing the heat sink shown in FIGS. 11 and 12.

FIG. 13 illustrates a processor module 120' including an electronic device package, such as a PCB assembly 122, an EMI clip 124, the heat sink 126', and a pair of heat sink retention clips 128a–128b. The base pedestal 135' of the heat sink 126' makes thermal and physical contact with approximately two-thirds of the electronic components mounted on the PCB assembly 122.

Figure 14:
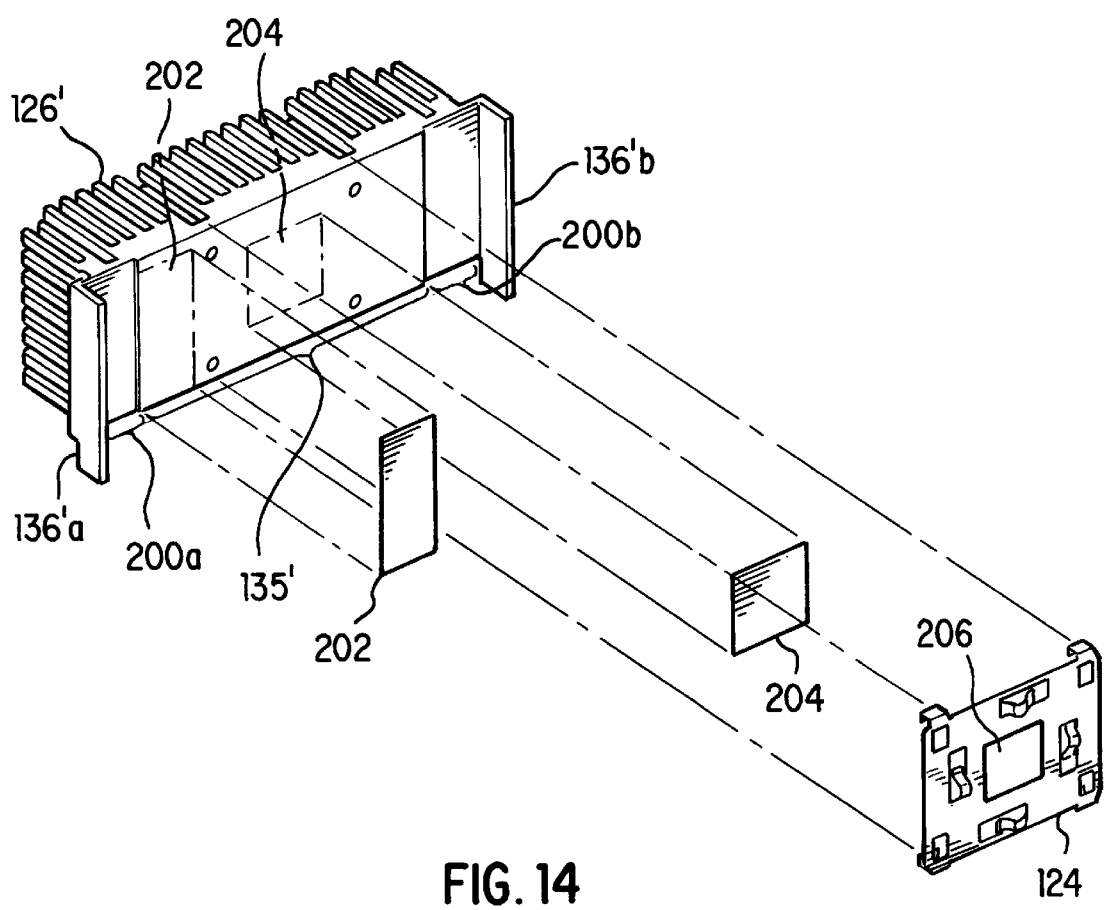
FIG. 14 is an exploded view of the components attached to the heat sink in accordance with a second embodiment of the present invention.

FIG. 14 illustrates the placement of thermal compounds on the bottom surface of the base pedestal of the heat sink 126'. There is shown a first thermal compound 202 and a second thermal compound 204. The EMI clip 124 is positioned over the second thermal compound 204. The aperture 206 of the EMI clip 124 allows the second thermal compound 204 to make direct physical and thermal contact with the electronic components on the PCB assembly 122. The second thermal compound 204 can be a dielectric layer that is used to provide high dielectric capacity and thermal conductivity between the electronic components on the PCB assembly 122 and the heat sink 126'. An example of such a compound is MCM-STRATE® manufactured by Power Devices, Inc. However, the present invention is not constrained to any particular type of material and other materials having the same properties can also be used.

Furthermore, the bottom side of the EMI clip 124, that side which touches the PCB assembly 122, is coated with a dielectric layer that ensures that the EMI clip 124 does not short the electronic components mounted on the surface of the PCB assembly 122. An example of such a dielectric coating is powder paint, in particular, the epoxy power coatings based on epoxy resins.

The first thermal compound 202 can be positioned on the bottom surface of the base pedestal 135' of the heat sink 126' on either side of the base pedestal where the EMI clip 124 is not attached. As shown in FIG. 14, the first thermal compound 202 is positioned on the base pedestal 135' of the heat sink 126' on one side that abuts the attached EMI clip 124. The first thermal compound 200 can be a dielectric layer that is used to provide high dielectric capacity and thermal conductivity between the electronic components on the PCB assembly 122 that it is in direct physical contact with and the heat sink 126'. Any of the well-known thermally conductive materials can be used for the first thermal compound 202.

The placement of the thermal compounds on the bottom surface of the heat sink 126' allows the heat sink 126' to be in thermal contact with the more heat intensive electronic components of the PCB assembly 122. As such, the heat sink 126' is able to more efficiently and effectively cool the PCB assembly 122.

Preferably, the first thermal compound 202 is a non-phase change thermal interface material and the second thermal compound 204 is a phase change thermal interface material. The first thermal compound 202 is in thermal contact with those electronic components that are less heat intensive and the second thermal compound 204 is in thermal contact with one or more of the heat intensive electronic components. The phase change thermal interface material provides a higher thermal performance than the non-phase change thermal interface material. The inclusion of the non-phase and phase change thermal interface materials on the bottom surface of the heat sink 126' enables the heat sink 126' to cool select electronic components in accordance with various thermal performance preferences.

The heat sinks described above have a significant economic advantage. The inclusion of the lever and rail guides on the heat sink eliminates the need for any additional components or complex mounting mechanisms on the processor retention assembly. As such, the processor retention assembly is easier to manufacture and less costly. In addition, the heat sink can be used with other types of processor assemblies, circuit boards, edge finger connection devices, and the like without affecting the processor retention assembly.

The foregoing description, for purposes of explanation, used specific nomenclature to provide a thorough understanding of the invention. However, it will be apparent to one skilled in the art that the specific details are not required in order to practice the invention. In other instances, well known electronic components and devices are shown in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A heat transfer apparatus for use with an electronic package that is housed in a retention mechanism, comprising:
    a base portion;
    a first rail guide coupled to the base portion and being detachably removable to the retention mechanism;
    a second rail guide coupled to the base portion and being detachably removable to the retention mechanism;
    the base portion including a first flange and a second flange, the first flange coupled to the first guide and the second flange coupled to the second guide;
    wherein the retention mechanism includes a first and second lock mechanism;
    wherein the first flange is used by the first lock mechanism to secure the heat transfer apparatus to the retention mechanism;
    wherein the second flange is used by the second lock mechanism to secure the heat transfer apparatus to the retention mechanism.

2. The apparatus of claim 1,
    wherein the electronic package includes a plurality of electronic components; and
    wherein the base portion is in thermal contact with a subset of said electronic components.

3. The apparatus of claim 2,
    wherein the subset includes a select one of said electronic components.

4. The apparatus of claim 1,
    wherein the first and second rail guides are coupled to opposite sides of the base portion.

5. The apparatus of claim 1, including:
    a finned heat radiating member extending upward and outward from said base portion.

6. The apparatus of claim 1,
    wherein the base portion includes a bottom surface that is in thermal contact with the electronic package;
    at least one thermal compound coupled to the bottom surface of the base portion and for improving the thermal cooling of the heat transfer device.

7. The apparatus of claim 6,
    a first thermal compound positioned in a first position on the bottom surface of the base portion, the first thermal compound is formed of a phase change thermal material; and
    a second thermal compound positioned in a second position on the bottom surface of the base portion, the second thermal compound is formed of a non-phase thermal material.

8. A heat sink for use with a retention assembly including a first wall, a second wall, a first lock lever, and a second lock lever, the first wall parallel to the second wall, the first wall including a first rail and the second wall including a second rail, the heat sink comprising:
    a base portion having a flat planar surface with a first edge and a second edge, the first edge opposite the second edge, the base portion including a first and second flange, the first flange for use with the first lock lever to secure the heat sink to the retention assembly, the second flange for use with the second lock lever to secure the heat sink to the retention assembly;
    a finned heat radiating member extending upward and outward from said base portion; and
    a first and second rail guides for removably mounting the heat sink into the retention assembly, the first rail guide coupled to the first edge of the base portion and fitted to slide into the first rail, the second rail guide coupled to the second edge of the base portion and fitted to slide into the second rail.

9. The heat sink of claim 8,
    the base portion including a base pedestal that is in thermal contact with an electronic component.

10. The heat sink of claim 8,
    the base portion including a base pedestal that is in thermal contact with a plurality of electronic components.

* * * * *